(12) United States Patent
Lee et al.

(10) Patent No.: US 7,890,846 B2
(45) Date of Patent: Feb. 15, 2011

(54) ELECTRONIC DATA FLASH CARD WITH REED SOLOMON ERROR DETECTION AND CORRECTION CAPABILITY

(75) Inventors: Charles C. Lee, Cupertino, CA (US); I-Kang Yu, Palo Alto, CA (US); Abraham C. Ma, Fremont, CA (US); Ming-Shiang Shen, Taipei Hsien (TW)

(73) Assignee: SuperTalent Electronics, Inc., San Jose, CA (US)

( * ) Notice: Subject to any disclaimer, the term of this patent is extended or adjusted under 35 U.S.C. 154(b) by 966 days.

(21) Appl. No.: 11/739,613

(22) Filed: Apr. 24, 2007

(65) Prior Publication Data

US 2007/0204206 A1   Aug. 30, 2007

Related U.S. Application Data

(63) Continuation-in-part of application No. 11/657,243, filed on Jan. 24, 2007, and a continuation-in-part of application No. 10/799,039, filed on Mar. 11, 2004, now abandoned, and a continuation-in-part of application No. 10/789,333, filed on Feb. 26, 2004, and a continuation-in-part of application No. 09/478,720, filed on Jan. 6, 2000, now Pat. No. 7,257,714.

(51) Int. Cl.
    *H03M 13/00* (2006.01)
(52) U.S. Cl. .................. 714/784; 714/781; 714/782

(58) Field of Classification Search ............... 714/781, 714/782, 784
See application file for complete search history.

(56) References Cited

U.S. PATENT DOCUMENTS

| | | | | |
|---|---|---|---|---|
| 5,761,102 A | * | 6/1998 | Weng | 708/492 |
| 5,931,894 A | * | 8/1999 | Wei | 708/492 |
| 5,983,389 A | * | 11/1999 | Shimizu | 714/781 |
| 7,407,393 B2 | | 8/2008 | Ni et al. | |
| 7,420,803 B2 | | 9/2008 | Hsueh et al. | |

* cited by examiner

*Primary Examiner*—Sam Rizk
(74) *Attorney, Agent, or Firm*—Maryam Imam; IPxLaw Group LLP

(57) ABSTRACT

One embodiment of the present includes a electronic data storage card having a Reed Solomon (RS) decoder having a syndrome calculator block responsive to a page of information, the page being organized into a plurality of data sections and the overhead being organized into a plurality of overhead sections. The syndrome calculator generates a syndrome for each of the data sections. The decoder further includes a root finder block responsive to the calculated syndrome and for generating at least two roots, a polynomial calculator block responsive to the at least two roots and operative to generate at least one error address, identifying a location in the data wherein the error lies, and an error symbol values calculator block coupled to the root finder and the polynomial calculator block and for generating a second error address, identifying a second location in the data wherein the error(s) lie.

17 Claims, 11 Drawing Sheets

$$(1 + \beta_1\alpha + \beta_2\alpha^2 + \beta_3\alpha^3 + \beta_4\alpha^4 + \beta_5\alpha^5 + \beta_6\alpha^6 + \beta_7\alpha^7) \quad * \quad (\beta_1\alpha + \beta_2\alpha^2 + \beta_3\alpha^3 + \beta_4\alpha^4 + \beta_5\alpha^5 + \beta_6\alpha^6 + \beta_7\alpha^7)$$

$$= (\beta_7 * \alpha^{14} + \beta_6 * \alpha^{12} + \beta_5 * \alpha^{10} + \beta_4 * \alpha^8) + \beta_7 * \alpha^7 + (\beta_6 + \beta_3) * \alpha^6 + \beta_5 * \alpha^5 + (\beta_4 + \beta_2) * \alpha^4 \qquad \text{Eq. (45)}$$

$$+ \beta_3 * \alpha^3 + (\beta_2 + \beta_1) * \alpha^2 + \beta_1 * \alpha$$

FIG. 8

| High\Low | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 00 | 01 | 02 | 03 | 04 | 05 | 06 | 07 | 08 | 09 | 0A | 0B | 0C | 0D | 0E | 0F |
| 1 | 10 | 11 | 12 | 13 | 14 | 15 | 16 | 17 | 18 | 19 | 1A | 1B | 1C | 1D | 1E | 1F |
| 2 | 20 | 21 | 22 | 23 | 24 | 25 | 26 | 27 | 28 | 29 | 2A | 2B | 2C | 2D | 2E | 2F |
| 3 | 30 | 31 | 32 | 33 | 34 | 35 | 36 | 37 | 38 | 39 | 3A | 3B | 3C | 3D | 3E | 3F |
| 4 | 40 | 41 | 42 | 43 | 44 | 45 | 46 | 47 | 48 | 49 | 4A | 4B | 4C | 4D | 4E | 4F |
| 5 | 50 | 51 | 52 | 53 | 54 | 55 | 56 | 57 | 58 | 59 | 5A | 5B | 5C | 5D | 5E | 5F |
| 6 | 60 | 61 | 62 | 63 | 64 | 65 | 66 | 67 | 68 | 69 | 6A | 6B | 6C | 6D | 6E | 6F |
| 7 | 70 | 71 | 72 | 73 | 74 | 75 | 76 | 77 | 78 | 79 | 7A | 7B | 7C | 7D | 7E | 7F |
| 8 | 80 | 81 | 82 | 83 | 84 | 85 | 86 | 87 | 88 | 89 | 8A | 8B | 8C | 8D | 8E | 8F |
| 9 | 90 | 91 | 92 | 93 | 94 | 95 | 96 | 97 | 98 | 99 | 9A | 9B | 9C | 9D | 9E | 9F |
| A | A0 | A1 | A2 | A3 | A4 | A5 | A6 | A7 | A8 | A9 | AA | AB | __88__ | __76__ | __76__ | __88__ |

Address 20 content is also 20 for simplicity;

Error_count = 0; No error occurred during Flash page read back

FIG. 9

| High \ Low | 0 | 1 | 2 | 3 | 4 | 5 | 6 | 7 | 8 | 9 | A | B | C | D | E | F |
|---|---|---|---|---|---|---|---|---|---|---|---|---|---|---|---|---|
| 0 | 00 | 01 | 02 | 03 | 04 | 05 | 06 | 07 | 08 | 09 | 0A | 0B | 0C | 0D | 0E | 0F |
| 1 | 10 | 11 | 12 | 13 | 14 | 15 | 16 | 17 | 18 | 19 | 1A | 1B | 1C | 1D | 1E | 1F |
| 2 | 80 | 21 | 22 | 23 | 24 | 25 | 26 | 27 | 28 | 29 | 2A | 2B | 2C | 2D | 2E | 2F |
| 3 | 90 | 31 | 32 | 33 | 34 | 35 | 36 | 37 | 38 | 39 | 3A | 3B | 3C | 3D | 3E | 3F |
| 4 | 40 | 41 | 42 | 43 | 44 | 45 | 46 | 47 | 48 | 49 | 4A | 4B | 4C | 4D | 4E | 4F |
| 5 | 50 | 51 | 52 | 53 | 54 | 55 | 56 | 57 | 58 | 59 | 5A | 5B | 5C | 5D | 5E | 5F |
| 6 | 60 | 61 | 62 | 63 | 64 | 65 | 66 | 67 | 68 | 69 | 6A | 6B | 6C | 6D | 6E | 6F |
| 7 | 70 | 71 | 72 | 73 | 74 | 75 | 76 | 77 | 78 | 79 | 7A | 7B | 7C | 7D | 7E | 7F |
| 8 | 80 | 81 | 82 | 83 | 84 | 85 | 86 | 87 | 88 | 89 | 8A | 8B | 8C | 8D | 8E | 8F |
| 9 | 90 | 91 | 92 | 93 | 94 | 95 | 96 | 97 | 98 | 99 | 9A | 9B | 9C | 9D | 9E | 9F |
| A | A0 | A1 | A2 | A3 | A4 | A5 | A6 | A7 | A8 | A9 | AA | AB | 88 | 76 | 76 | 88 |

Address 20 content is 80, correct value should be 20

Address 30 content is 90, correct value should be 30

Error_count = 2
Err_adr1 = 20;
Err_adr2 = 30;
Err_val1 = A0;
Err_val2 = A0;

First error correction 1000, 0000 <- 80
XOR 1010, 0000 <- A0
    ─────────────
    0010, 0000 <- 20, correct data, and
                     return this value back Second error correction 1001, 0000 <- 90
XOR 1010, 0000 <- A0
    ─────────────
    0011, 0000 <- 30, correct data, and
                     return this value back

FIG. 11

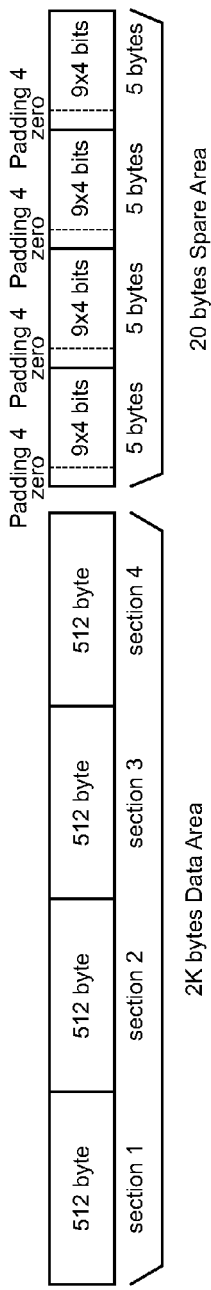

US 7,890,846 B2

ELECTRONIC DATA FLASH CARD WITH REED SOLOMON ERROR DETECTION AND CORRECTION CAPABILITY

CROSS REFERENCE TO RELATED APPLICATION

This application is a continuation-in-part (CIP) of the co-pending U.S. patent application Ser. No. 09/478,720, entitled "Electronic Data Storage Medium with Fingerprint Verification Capability", and filed on Jan. 6, 2000, and a continuation-in-part of the co-pending U.S. Patent Application Publication No. US 2005/0193161 A1, entitled "System and Method for Controlling Flash Memory", filed on Feb. 26, 2004 and a continuation-in-part of the co-pending U.S. patent application Ser. No. 10/799,039, entitled "SYSTEM AND METHOD FOR MANAGING BLOCKS IN FLASH MEMORY", and filed on Mar. 11, 2004, and is further a CIP of the co-pending U.S. patent application Ser. No. 11/657,243, entitled "Electronic Data Flash Card with Bose, Ray-Chaudhuri, Hocquenghem (BCH) Error Detection/Correction", filed on Jan. 24, 2007, the disclosures of all of which are incorporated herein as though set forth in full.

BACKGROUND OF THE INVENTION

1. Field of the Invention

The present invention relates to non-volatile memory devices and particularly to an error detection method and apparatus using Reed Solomon coding and decoding techniques for error detection and correction in the non-volatile memory devices.

2. Description of the Prior Art

Currently, confidential data files are stored in Floppy disks or are delivered via networks that require passwords or that use encryption coding for security.

Confidential documents can be sent by adding safety seals and impressions during delivery. Nevertheless, confidential documents are exposed to the risks of undesirable intrusions, such as breaking of the passwords, encryption codes, safety seals and impressions, thereby resulting in unsecured transfer of information. Thus, the need arises for supplemental security measures.

With the advent of the popularity of flash memory, density of flash memory devices (or chips, integrated circuits or semiconductor) is increasing thereby increasing the rate of defect spots. Even more noteworthy is the increase in the rate of defect spots in Multi-Level Cell (MLC), which is a certain type of non-volatile memory, during the flash manufacturing process. Compared with a SLC process, random error bits in MLC processes occur more often due to multi-level threshold voltages (less noise margin) needed to detect logic levels.

While flash memory is becoming more popular each day, as the density of flash chips are increasing, defect rates are also increasing, especially with Multi-Level Cell (MLC) technology being introduced in flash manufacturing processes. An effective error detection and correction method is needed for operations using flash or non-volatile memory to ensure data correctness particularly with in light of a higher flash chip defect density. The need therefore arises for the use of hardware as well as software solutions for detecting errors and for even correcting errors so that the error(s) remain invisible to the end users. Additionally, manufacturing costs can be lowered.

An effective error detection results when using Reed Solomon coding techniques for detection and correction of errors in systems using flash or non-volatile memory. Therefore, an apparatus and method are needed for flash operations to improve the accuracy of information.

Normally, four procedures are involved in the Reed Solomon decoding process as follows:

(1). Syndrome calculation: Each syndrome will be calculated based on read out string of data from flash memory, a non-zero value determines the error numbers.
(2). Error location polynomial calculation: it will find out the polynomial coefficient.
(3). Root finding based on Error Location Polynomial.
(4). Reciprocal of root will determine the error location of read out strings.
(5). Use Syndrome value and Error location polynomial coefficient to find out error values associated with each error location.
(6). Recover original strings of value and return the 512 bytes sector data to request unit.

The foregoing procedure (2) normally uses Berlekamp-Messay recursive method or Euclidian's matrix method, the complexity of these two methods are depend on code length, and independent of error numbers.

The foregoing procedure (3) is used to find roots of error polynomial normally adopts Chien's searching method, the calculation time also depends on code length. The above two methods do not fully utilize the characteristic of low error counts of flash memory, and require sophisticated hardware and longer calculation time.

What is needed is electronic medium or card having non-volatile (or flash) memory and Reed Solomon coding and decoding apparatus and method using advantageously reduced complexity of circuitry to reduce costs of manufacturing of the electronic medium.

SUMMARY OF THE INVENTION

One embodiment of the present includes an electronic data storage card having a Reed Solomon (RS) decoder having a syndrome calculator block responsive to a page of information, the page being organized into a plurality of data sections and the overhead being organized into a plurality of overhead sections. The syndrome calculator generates a syndrome for each of the data sections. The decoder further includes a root finder block responsive to the calculated syndrome and for generating at least two roots, a polynomial calculator block responsive to the at least two roots and operative to generate at least one error address, identifying a location in the data wherein the error lies, and an error symbol values calculator block coupled to the root finder and the polynomial calculator block and for generating a second error address, identifying a second location in the data wherein the error(s) lie.

These and other objects and advantages of the present invention will no doubt become apparent to those skilled in the art after having read the following detailed description of the preferred embodiments illustrated in the several figures of the drawing.

IN THE DRAWINGS

FIG. 9 shows a table of an example of RS(176, 172) coding wherein no errors have been detected.

FIG. 11 shows a table of an example of RS(176, 172) coding wherein two errors have been detected.

FIG. 12 shows an example of a page, in sections, using the general approach RS, in accordance with an alternative embodiment of the present invention.

FIG. 13 shows a calculation or implementation of the Eq. (65) hereinabove.

DETAILED DESCRIPTION OF THE PREFERRED EMBODIMENT(S)

In one embodiment of the present invention, a Reed Solomon error detection and correction (or coding and decoding) method is used in conjunction with non-volatile memory by resolving complex roots finding of error location polynomial, which in turn simplifies the circuitry employed. In one embodiment of the present invention, the reduction in hardware results in approximately 11 exclusive OR gates, or other circuitry equivalent thereto. ROM or complex hardware is avoided for cost saving and computation delay.

Flash, which is one type of non-volatile memory, is known to, at times, have bit errors according to manufacturing defect(s) or repeated read/write/erase operation. Error correction coding (ECC) methods and techniques are commonly employed in flash applications. However, increased defect bits, in page access operations, require powerful ECC methods. An embodiment of the present invention addresses such a need and provides an effective and cost sensitive solution therefor.

According to an embodiment of the present invention, an electronic data flash card with Reed Solomon error detection and correction capability is adapted to be accessed by an external computer. The electronic data flash card is a subsystem for electronic storage medium card with fingerprint verification capability. The electronic data flash card includes a flash memory device, an input-output interface circuit, and a processing unit. The external computer includes a function key set and a display unit.

The memory device stores a data file.

The input/output interface circuit is activated so as to establish communication with the external computer. The processing unit is connected to the memory device and the input/output interface circuit. The processing unit is operable selectively in a programming mode, where the processing unit activates the input/output interface circuit to receive the data file from the external computer, and to store the data file in the memory device, and a data retrieving mode, where the processing unit access the data file stored in the memory device, and activates the input/output interface circuit to transmit the data file to the external computer. An embodiment of the present invention relates to an electronic data flash card that is particularly to a system and method for providing error recovery method on Electronic data flash card.

For more familiarity with flash systems, the reader is referred to U.S. Pat. No. 7,103,684, issued on Sep. 5, 2006, to Chen et al. and entitled "Single-Chip USB Controller Reading Power-On Boot Code from Integrated Flash Memory for User Storage", the contents of which are incorporated by reference as though set forth in full.

Figure 1:
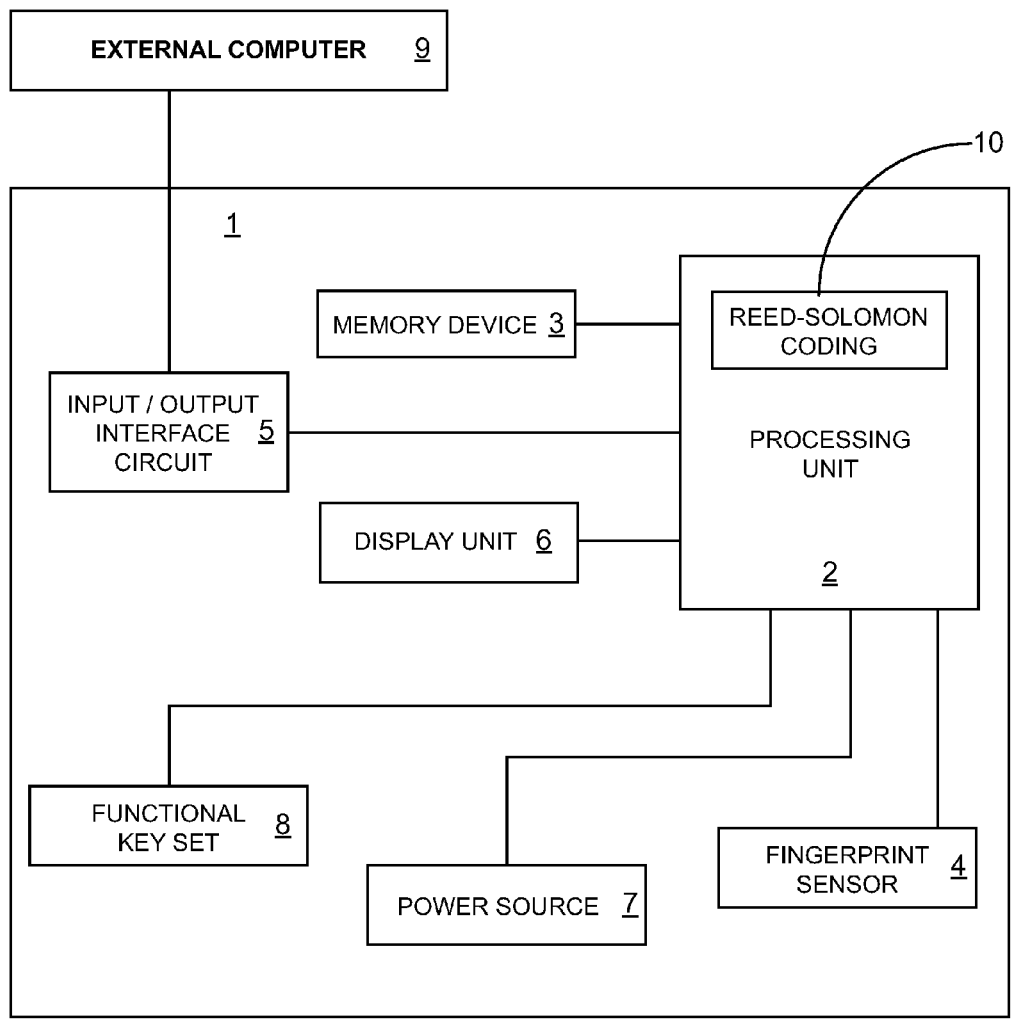
FIG. 1 shows an electronic data storage card 1 with having Reed Solomon coding/decoding capability for error detection and correction capability, in accordance with an embodiment of the present invention.

Referring now to FIG. 1, according to an embodiment of the present invention, an electronic data flash card 1 is shown to include Reed Solomon error detection and correction capability and accessed by an external computer 9. The card 1 is shown to include a processing unit 2, a memory device 3, and an input/output interface circuit 5. The processing unit 2 is shown to include a Reed Solomon decoder 10 for performing error detection and correction.

In FIG. 1, the memory device 3 can be a flash memory device that stores data files. Fingerprint sensor 4 scans a fingerprint of a user to generate fingerprint scan data. Processing unit 2 connects to other computers and can operate in various modes, such as a programming mode, a data retrieving mode, and a data resetting mode. Power source 7 supplies electrical power to the processing unit 2. The function key set 8 allows the user to input a password that is verified by processing unit 2. The display unit 6 shows the operating status of the electronic data storage medium with fingerprint verification capability.

The memory device 3, in one embodiment of the present invention, is a flash memory device and is mounted on the electronic data flash card 1, and is for storing one or more data file. An exemplary data file is a picture file or a text file.

The input/output interface circuit 5, such as a Universal Serial Bus (USB) or equivalent interface, is mounted on the card body, and is activated so as to establish communication a USB with the external computer 9. The input/output interface circuit 5 includes a security circuitry, and a voltage regulator system. The input/output interface circuit 5 may be MMC, SD, CF, MS, PCI-Express, IDE, SATA, etc.

The processing unit 2 is mounted on the card body 1, and is connected to the memory device 3, and the input/output interface circuit 5. The processing unit 2 includes a microprocessor, a ROM, a RAM, and a (Error detection and correction Code) (ECC), such as a Reed Solomon coding/decoding circuit, as shown in FIG. 1. Examples of microprocessors included within the processing unit 2 are 8051, 8032, 80286, RISC, ARM, MIPS or digital signal processor, etc. The ROM (Read Only Memory) is a non-volatile memory wherein reside the boot and executable codes for controlling the operation of the remainder of the blocks/devices shown in the electronic data flash card 1. The RAM (Random Access Memory) is a volatile memory used as a storage device for temporary storage and code shadowing. The ECC is used for data error detection and correction for which responsible for the reliability and integrity of the data error. Mounted, as used herein, refers the process of placing the item to be mounted in the electronic card, using known techniques.

Reed Solomon (RS) algorithm has been popularly used in the past for detection and correction of errors. A first method of such use is to find roots of an error polynomial is employing the Berlekamp-Messay and Euclidian methods, then apply Chien's method to search for error locations. However, since implementation of prior art techniques requires complex hardware and lengthy calculations, cost of ECC based on such RS algorithm is higher.

In an embodiment of the present invention using Reed Solomon coding/decoding, as the decoder 10 of FIG. 1, costs attributed to hardware, such as for silicon area ROM look up, are reduced, also lengthy calculations based on Chien's searching algorithm are eliminated.

The present invention is based on the low error count characteristic, i.e. less than two error counts occurring per code word. Code words are readily used and known in ECC techniques. Embodiments of the present invention use the syndrome result, in the RS algorithm, to locate the error, which is known to be the most difficult process during RS algorithm. This advantageously simplifies the structure of the circuit/software used to the ECC, reduces hardware complexity, simplifies signal handling, increases speed of operation, and is not influenced by code length. To better understand the various embodiments of the present invention, an example will now be used.

Figure 2:
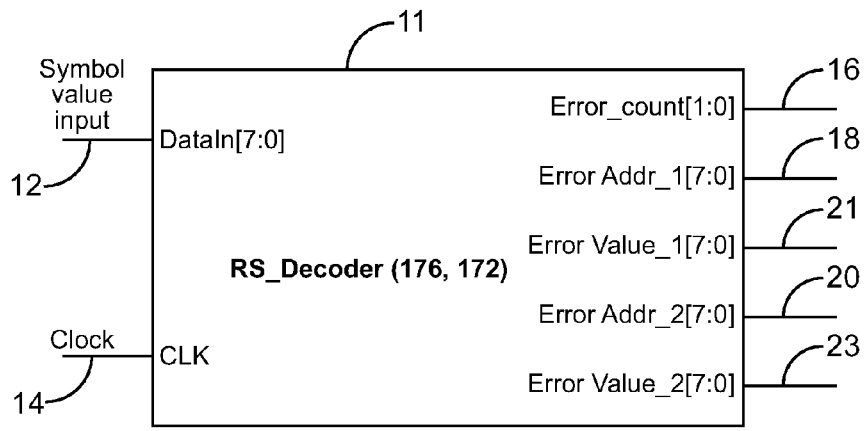
FIG. 2 shows a RS decoder 11, in accordance with an embodiment of the present invention.

Referring now to FIG. 2, a RS decoder 11 is shown to receive data on the data bus 12, in synchronicity with a clock signal 14 and operative to generate an error count on the error count signals 16 and an error address 1 on an error address 1 signal 18 and an error address 2 on an error address 2 signal 20, and a first error value on the error value 1 signal 21 and a second error value on the error value 2 signal 22, in accordance with an embodiment of the present invention. The data bus 12 carries data of various bit sizes. In the embodiment of FIG. 1, the data is 8 bits in size and the error count on the signals 16 is two bits so as to have the capability of reporting up to two errors in the data. In the event there is one error in the data, the location of the error is indicated on the signal 18 and in the event there is a second error, the location of the second error is indicated on the signal 20. The decoder 11 can be employed in various applications requiring error detection and correction, such as in flash (or non-volatile) memory applications, as shown and discussed herein.

Figure 3:
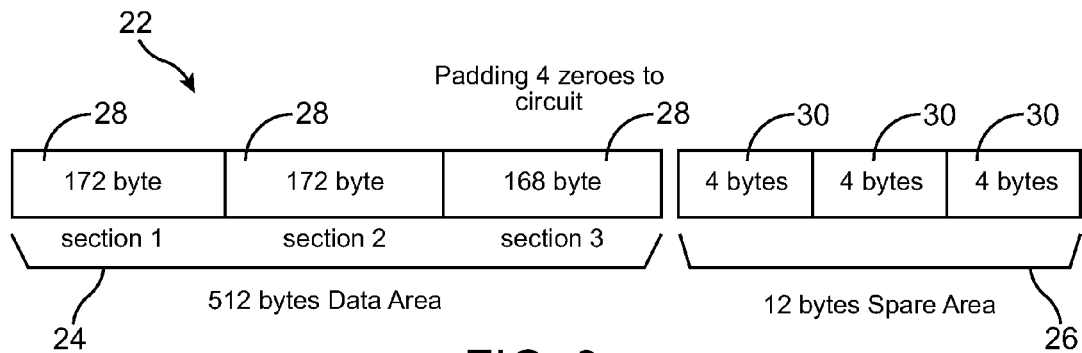
FIG. 3 shows a flash memory page structure 22, in accordance with an embodiment of the present invention.

FIG. 3 shows a flash memory page structure 22 having a data area 24 and a spare area 26, in accordance with an embodiment of the present invention. The spare area 26 includes overhead, which includes information regarding the data or raw data. The data area 24 includes raw data. Raw data and overhead are information included in a sector or page of information where the overhead includes information related to the data being stored or retrieved. Once such information related to data is ECC. A page, in certain flash or non-volatile memory applications, is the same as a sector. While a page may be of varying sizes, in the embodiment of FIG. 3, a page is 528 bytes, 512 bytes of which are data, in the data area 24, and 12 bytes of which are overhead or spare, in the spare area 26, dedicated for ECC purpose.

In FIG. 3, data in the data area 24, is further organized into three data area sections 28 with the first two data area sections 28 being each 172 bytes in size and the last data area section 28 being 168 bytes in size but having pad zero bytes to raise the size thereof to 172 bytes. This advantageously equalizes the size of each of the data area sections. Alternatively, other number of sections may comprise a sector and a section may include other number of bytes.

In FIG. 3, the spare area 26 is shown to include 12 bytes of overhead organized into three sections with each section being four bytes, or 32 bits, in size. Since in the RS algorithm of the exemplary embodiment of FIG. 3, a symbol size is 8 bites, m=8, for 2 bytes of correctable error capability per 172 bytes, and advantageously, only 32 bits (4 bytes) need be utilized for ECC for each 172 byte section.

Sectional organization of the data area 24 and the spare area 26 causes reduction in the code length, in turn, simplifying the RS method by parallel processing 3 sections at the same time with the total number of correctable errors being 6 bytes total per 512 bytes.

Figure 4:
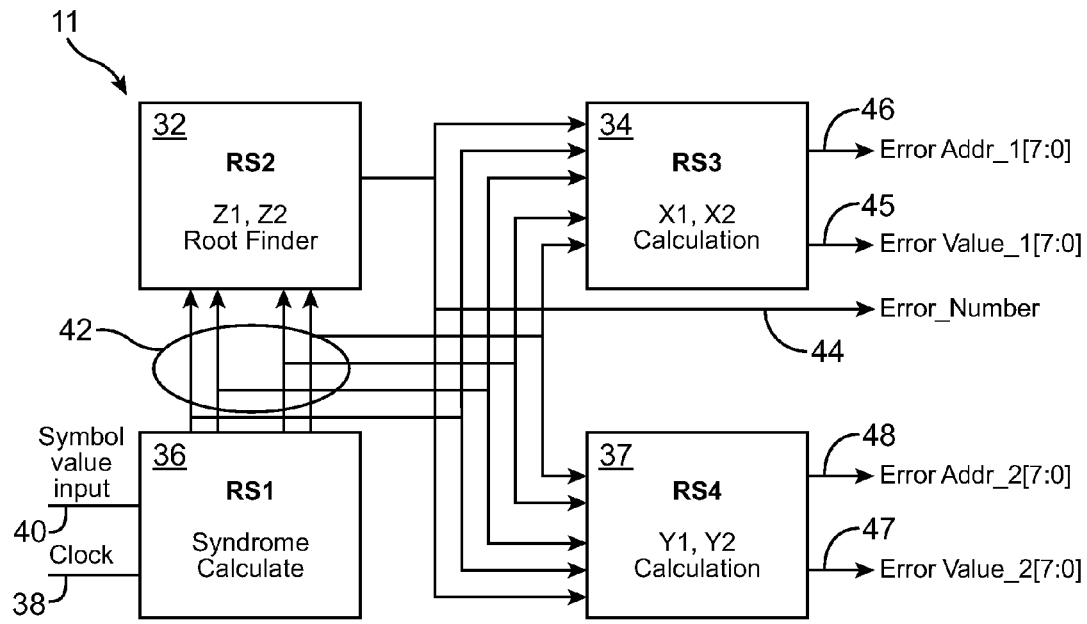
FIG. 4 shows further details of the decoder 11 of FIG. 2, in accordance with an embodiment of the present invention.

FIG. 4 shows further details of the decoder 11 of FIG. 2, in accordance with an embodiment of the present invention. In FIG. 4, the decoder 11 is shown to include a syndrome calculate block 36, a root finder block 32 and a polynomial calculator 34 and a Y1, Y2 (error symbol values) calculator block 37. The block 36 is shown to receive a clock signal 38 and a bit value input signal 40 and is operative to generate and couple a calculated syndrome onto the syndrome signals 42, which are received by the block 32 and the block 34 and the block 37. Further shown in FIG. 4, is the output of the block 32 serving as input to the block 34 and to the block 37.

In FIG. 4, the block 36 is shown to generate an error number (Error_Number) signal 44, which is the signal 16 of FIG. 2 and the block 34 is shown to generate error addresses (Error Addr_1) signals 1 46 and the block 37 is shown to generate error addresses (Error Addr_2) 2 48, which are the same as the signals 18 and 20 of FIG. 2, respectively. Moreover, a first error value signals (Error Value_1) 45 is shown generated by the block 34 and a second error value signals (Error Value_2) 47 is shown generated by the block 37. The signals 45 and 47 are the same as the signals 21 and 23, respectively, of FIG. 2. The block 37 calculates Y1 and Y2, in accordance with equation(s) that will be presented shortly.

Figure 5:
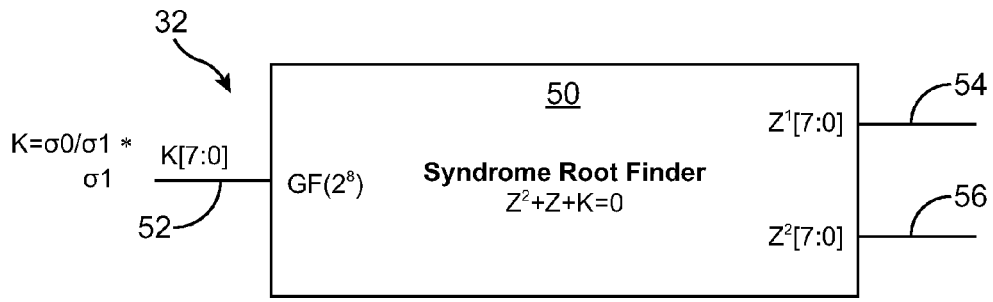
FIG. 5 shows an exemplary embodiment of the block 32 wherein a syndrome root finder 50 is shown to receive a syndrome K.

FIG. 5 shows an exemplary embodiment of the block 32 wherein a syndrome root finder block 50 is shown to receive a syndrome K, of 8 bits, on the syndrome signal 52 provided by the block 36 of FIG. 4 and is further shown to generate two roots, $Z^1$, generated onto the $Z^1$ signal 54 and $Z^2$, generated onto the $Z^2$ signal 56. Each of the roots, $Z_1$ and $Z_2$ are shown to be 8 bits, as denoted by $Z^1[7:0]$ and $Z^2[7:0]$, respectively, and the syndrome K is shown to be 8 bits, as denoted by K[8:0] with the notation "[X:0]" generally being X+1 in size. The signals 54 and 56 are each provided to the block 34. The example of FIG. 5 is carried through to subsequent figures to provide better understanding of additional details of the blocks of FIG. 4. In relation therewith, equations are presented below in a manner consistent with the figures. In one embodiment of the present invention, the block 50 causes the following equation to be implemented:

$$Z^2+Z+K=0 \hspace{2cm} \text{Eq. (0)}$$

Figure 6:
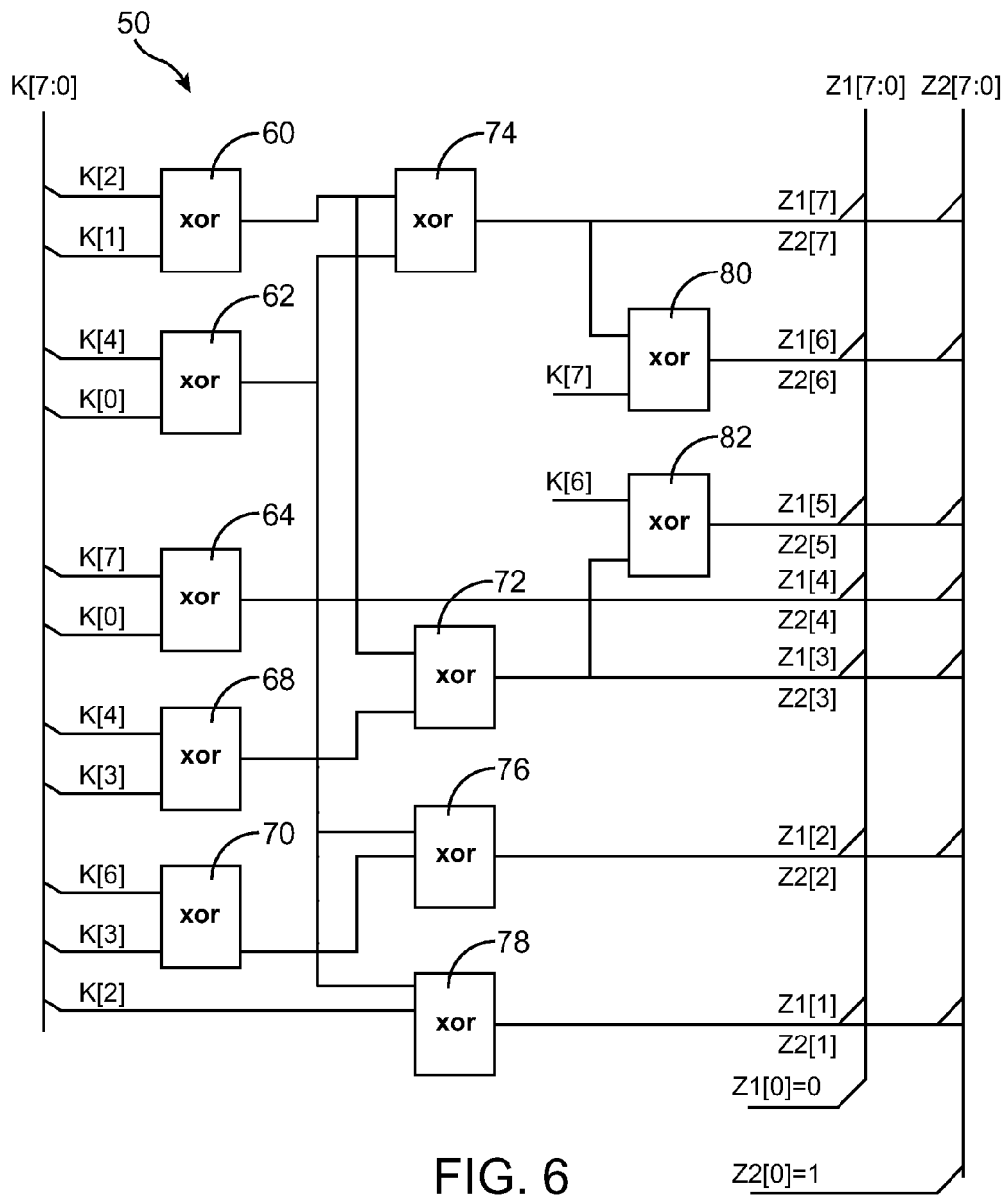
FIG. 6 shows further details of the block 50 of the example of FIG. 5.

FIG. 6 shows further details of the block 50 of the example of FIG. 5. The block 50 is shown to include XOR blocks 60-90 for generating the two roots $Z_1$ and $Z_2$ onto the signals 54 and 56, respectively. The syndrome K[7:0] is received as previously noted and each of its bits are 'XOR'ed or compared to each other, in stages, in the manner shown in FIG. 6. For example, in the first stage of XORs, bits K[2] or the third bit of K are shown XORed with K[1] or the second bit of K. K[4] is shown XORed with K[0] and so on. The first stage of XORs is shown to include the XORs 60-70, the second stage of XORs is shown to include XORs 72-78, the third stage is shown to include XORs 80 and 82 and so forth. In a second stage of comparison, the outputs of some of the first stage of XORs are shown XORed to each other, in a manner consistent with that shown in FIG. 6. Some XORs beyond the first stage also compare a bit from K to the output of another XOR, for example, the XOR 80 is shown to compare the output of the XOR 74 to K[7] or the eighth bit of K. The finder 50 of FIG. 5 causes implementation of Eq. (0) and is an exemplary calculation of a Galois Field (GF) ($2^8$).

In the interest of further clarification, an example of error count using the finder 50 is now presented. The example is intended to be used for flash or non-volatile memory error recovery and in the case where a page is 528 bytes in length. A page is 512 bytes of data and 16 bytes of spare or overhead, in the foregoing example, wherein, 12 bytes of the overhead are used for RS or ECC overhead. Each page is divided or organized into three sections, as previously discussed. Also, in this example, two bytes of errors are assumed to be present. Assume, for the sake of example, that two error counts format (RS) code are based on Galois Field GF($2^8$), where each symbol size is 8 bits in size. RS(N, N−4) wherein 'N' is the code length, and $4<N\leq255$, N−4 is the length of message unit and it is the read out code in data area of flash memory, 4 bytes is the parity bytes generated from RS encoder, and reside in per sector (page) spare areas of flash memory. A page or sector is storage units and units in which information is transferred. In certain applications of non-volatile memory, information, such as sector information, is stored in non-volatile memory organized in sectors or pages. More specifically, non-volatile memory is organized into blocks, with each block being organized into pages or sectors.

Assuming r(x) is the receiving polynomial,
c(x) is the correct code word polynomial,
e(x) is error polynomial, $$r(x)=c(x)+e(x) \quad \text{Eq. (1)}$$

Since two error bytes are assumed to be correctable by the foregoing RS code, four syndromes $S_i$ (i=0, 1, 2, 3), ($S_i$ denotes a syndrome) and also assuming that two error positions are denoted as $i_1$, $i_2$ with each $i_1$ and $i_2$ being an error position; then error symbol values are $Y_1$, $Y_2$;

$$S_j = Y_1 * X_1^j + Y_2 * X_2^j; \quad \text{Eq. (2)}$$

In Eq. (2), $X_1=\alpha^{i_1}$, $X_2=\alpha^{i_2}$; wherein $X_1$ and $X_2$ are each an error location polynomial $$\sigma(x)=(x-X_1)*(x-X_2)=x^2+\sigma_1 x+\sigma_0; \quad \text{Eq. (3)}$$

$$\sigma_1=X_1+X_2; \quad \sigma_0=X_1*X_2; \quad \text{Eq. (4)}$$

Wherein σ denoting coefficients of the polynomials:

$$S_0=Y_1*X_1^0+Y_2*X_2^0=Y_1+Y_2; \quad \text{Eq. (5)}$$

$$S_1=Y_1*X_1^1+Y_2*X_2^1=Y_1*X_1+Y_2*X_2; \quad \text{Eq. (6)}$$

$$S_2=Y_1*X_1^2+Y_2*X_2^2=S_1*\sigma_1+S_0*\sigma_0; \quad \text{Eq. (7)}$$

$$S_3=Y_1*X_1^3+Y_2*X_2^3=S_2*\sigma_1+S_1*\sigma_0; \quad \text{Eq. (8)}$$

from the above Eqs. (5) to (8) equations, $\sigma_1$ and $\sigma_0$ are calculated, as follows:

$$\sigma_1=(S_1 S_2+S_0 S_3)/(S_1^2+S_0 S_2); \quad \text{Eq. (9)}$$

$$\sigma_0=(S_2^2+S_1 S_3)/(S_1^2+S_0 S_2); \quad \text{Eq. (10)}$$

and error values are obtained as follows:

$$Y_2=(S_0 X_1+S_1)/\sigma_1; \quad \text{Eq. (11)}$$

$$Y_1=S_0+Y_2; \quad \text{Eq. (12)}$$

(1)
If no errors occurred, then $$S_0=S_1=S_2=S_3=0; \quad \text{Eq. (13)}$$

(2)
In the case of a single error occurrence, and assuming the error location to be denoted as $i_1$, the error value is $Y_1$, A, B, C values are calculated as below:

$$A=S_1^2+S_0 S_2; \quad \text{Eq. (14)}$$

$$B=S_1 S_2+S_0 S_3; \quad \text{Eq. (15)}$$

$$C=S_2^2+S_1 S_3; \quad \text{Eq. (16)}$$

$$S_0=Y_1\neq 0; \quad \text{Eq. (17)}$$

$$S_1=Y_1*X_1\neq 0; \quad \text{Eq. (18)}$$

$$S_2=Y_1*X_1^2\neq 0; \quad \text{Eq. (19)}$$

$$S_2=Y_1*X_1^3\neq 0; \quad \text{Eq. (20)}$$

all $S_i$'s not being equal to 0 ($\neq 0$) does not imply that there are four errors, but this does imply the occurrence of at least one error.

But it is known, from the foregoing equations, that $Y_1=S_0$; $X_1=S_1/Y_1=S_1/S_0$;

$$\sigma_1=(S_1 S_2+S_0 S_3)/(S_1^2+S_0 S_2)=X_1^3 Y_1^2+X_1^3 Y_1^2=0<=B; \quad \text{Eq. (21)}$$

$$\sigma_0=(S_2^2+S_1 S_3)/(S_1^2+S_0 S_2)=X_1^4 Y_1^2+X_1^4 Y_1^2=0<=C; \quad \text{Eq. (22)}$$

$$A=X_1^2 Y_1^2+X_1^2 Y_1^2=0<=A; \quad \text{Eq. (23)}$$

Thus, if A=B=C=0, this indicates that there is only one error in the codeword.

(3)
If two errors occur in the code word or the read data, and assuming $i_1$, $i_2$ are the error locations, $Y_1$, $Y_2$ are two error symbol values, then:

$$S_0=Y_1*X_1^0+Y_2*X_2^0=Y_1+Y_2\neq 0 \quad \text{Eq. (24)}$$

The reason for Eq. (24) is that two non-zero symbol values added together should not equal zero;

$$S_1 = Y_1 * X_1^1 + Y_2 * X_2^1 \quad \text{Eq. (25)}$$
$$= Y_1 * X_1 + Y_2 * X_2 \neq 0;$$

$$S_2 = Y_1 * X_1^2 + Y_2 * X_2^2 \neq 0 \quad \text{Eq. (26)}$$
$$= S_1 * \sigma_1 + S_0 * \sigma_0;$$

$$S_3 = Y_1 * X_1^3 + Y_2 * X_2^3 \neq 0 \quad \text{Eq. (27)}$$
$$= S_2 * \sigma_1 + S_1 * \sigma_0;$$

$$A = S_1^2 + S_0 S_2 \quad \text{Eq. (28)}$$
$$= (X_1^2 + X_2^2) Y_1 * Y_2 \neq 0$$

since any arbitrary number square, added together, must be greater than zero, if $X_1$, $X_2$ are not zero because two errors occurred;

$$B=S_1 S_2+S_0 S_3=(X_1+X_2)*(X_1^2+X_2^2)*Y_1*Y_2\neq 0; \quad \text{Eq. (29)}$$

$$C=S_2^2+S_1 S_3=X_1*X_2*(X_1^2+X_2^2)*Y_1*Y_2\neq 0; \quad \text{Eq. (30)}$$

Using cyclic characteristic of Galois Fields (GF), an assumption can be made that:

$$x = \sigma_1 * z \quad \text{Eq. (31)}$$

in order to make $\sigma(x) = x^2 + \sigma_1 x + \sigma_0$ simple, it is easier to obtain $\sigma(z) = z^2 + z + K$; Eq. (31A)

where $K = \sigma_0/\sigma_1^2$

Once the root of Eq. (31A) is found, $x = \sigma_1 * z$ can be recovered again.

An assumption can be made that $x = \sigma_0 * z$, however, no benefit is realized for doing so since it cannot simplify $\sigma(x)$ equation (Eq. (31A)).

The roots of $\sigma(x)$ are error locations $X_1$, $X_2$, where the error symbols location occurs. Most of the RS decoding problems are associated with finding these two roots.

A cost effective method and apparatus, in accordance with an embodiment of the present, for finding the two roots will now be presented.

Assume $Z_1$, and $Z_2$ are roots of $\sigma(z)$, $$Z_1^2 + Z_1 + K = 0; \quad \text{Eq. (32)}$$

$$Z_2^2 + Z_2 + K = 0; \quad \text{Eq. (33)}$$

Subtraction of these two equations, results in:

$$(Z_1^2 - Z_2^2) + (Z_1 - Z_2) = 0, \quad \text{Eq. (34)}$$

in Galois field operation "−" is identical with "+",

We get $(Z_1^2 + Z_2^2) + (Z_1 + Z_2) = 0,$ Eq. (35)

since $2 * Z_1 * Z_2 = Z_1 * Z_2 + Z_1 * Z_2 = 0;$ Eq. (36)

because two identical term added together equals zero under Galois operation.

We get $(Z_1^2 + Z_2^2 + 2Z_1*Z_2) + (Z_1+Z_2) = 0, (Z_1+Z_2)^2 + (Z_1+Z_2) = 0;$ Eq. (37)

$$(Z_1+Z_2)*(Z_1+Z_2+1) = 0; \quad \text{Eq. (38)}$$

It means $Z_1 + Z_2 = 0;$ or $Z_1 + Z_2 + 1 = 0;$ Eq. (39)

However $Z_1 = Z_2$ is not possible, as two error locations should not be the same, thus, the only choice we have is $$Z_1 = Z_2 + 1; \text{ or } Z_2 = Z_1 + 1; \text{ or } Z_1 + Z_2 = 1; \quad \text{Eq. (40)}$$

Three equations exist at the same time under Galois operation.

Also 1 in above equation means (1000 0000) if $GF(2^8)$, we know $Z_1$ and $Z_2$ highest bit (bit position 0) should be toggle to each other.

Examples like $Z_1 = \underline{0}110\ 0110;$
$Z_2 = \underline{1}110\ 0110;$ underline Least Significant Bit (LSB) toggle to each other according to above explanation.

Again $Z_1^2 + Z_1 + K = 0;$ $$Z_1 * (Z_1 + 1) + K = 0; \quad \text{Eq. (41)}$$

$$Z_1 * (Z_1 + 1) = K; \quad \text{Eq. (42)}$$

We can assume $$Z_1 = \beta_1*\alpha + \beta_2*\alpha^2 + \beta_3*\alpha^3 + \beta_4*\alpha^4 + \beta_5*\alpha^5 + \beta_6*\alpha^6 + \beta_7*\alpha^7; \quad \text{Eq. (43)}$$

Then $$Z_1 + 1 = 1 + \beta_1*\alpha + \beta_2*\alpha^2 + \beta_3*\alpha^3 + \beta_4*\alpha^4 + \beta_5*\alpha^5 + \beta_6*\alpha^6 + \beta_7*\alpha^7; \quad \text{Eq. (44)}$$

$\beta_j$ is 1 or 0 only in above derivation, so equalities hold for $\beta_j*\beta_j = \beta_j$, $\beta_j + \beta_j = 0$.

(43), (44) These Two terms can be swapped without influencing the final result,

Multiply two terms together, we get $$(\beta_7*\alpha^{14} + \beta_6*\alpha^{12} + \beta_5*\alpha^{10} + \beta_4*\alpha^8) + \beta_7*\alpha^7 + (\beta_6 + \beta_3)*\alpha^6 + \beta_5*\alpha^5 + (\beta_4+\beta_2)*\alpha^4 + \beta_3*\alpha^3 + (\beta_2+\beta_1)*\alpha^2 + \beta_1*\alpha = K; \quad \text{Eq. (45)}$$

Owing to the fact that $\beta_7*\beta_7 = \beta_7$;
Also $07 = 0$;
If Galois Field $GF(2^8)$ is reference, there can be found:
$\alpha^{14} = (1100\ 0000) = 1 + \alpha + \alpha^4$;
$\alpha^{12} = (1011\ 0011) = 1 + \alpha^2 + \alpha^3 + \alpha^6 + \alpha^7$
$\alpha^{10} = (0010\ 1110) = \alpha^2 + \alpha^4 + \alpha^5 + \alpha^6$;
$\alpha^8 = (1011\ 1000) = 1 + \alpha^2 + \alpha^3 + \alpha^4$;

Substitute these four values into above equation, we find $$\beta_7 + \beta_6 = K_7; \quad \text{Eq. (46)}$$

$$\beta_3 + \beta_5 = K_6; \quad \text{Eq. (47)}$$

$$\beta_7 + \beta_5 + \beta_2 = K_4; \quad \text{Eq. (48)}$$

$$\beta_6 + \beta_4 + \beta_3 = K_3; \quad \text{Eq. (49)}$$

$$\beta_6 + \beta_5 + \beta_4 + \beta_2 + \beta_1 = K_2; \quad \text{Eq. (50)}$$

$$\beta_7 + \beta_1 = K_1; \quad \text{Eq. (51)}$$

$$\beta_7 + \beta_6 + \beta_4 = K_0; \quad \text{Eq. (52)}$$

$K = \sigma_0/\sigma_1^2$ wherein, $\sigma_0$ and $\sigma_1$ are each an error location polynomial $$= K_7*\alpha^7 + K_6*\alpha^6 + K_5*\alpha^5 + K_4*\alpha^4 + K_3*\alpha^3 + K_2*\alpha^2 + K_1*\alpha^1 + K_0; \quad \text{Eq. (53)}$$

$K_j (j=7 \ldots 0)$ are coefficient of 8 bit symbol value;

Comparing Eqs. (46) and (52), there is obtained
$$\beta_4 = K_7 + K_0; \quad \text{Eq. (54);}$$

adding Eqs. (48), (50), and (51), also substitute $\beta_4$ in, all double terms are eliminated because of Galois "+" is actually exclusive OR function.

There is obtained $\beta_6 = K_7 + K_4 + K_2 + K_1 + K_0;$ Eq. (55)

From Eq (46), we get $\beta_7 = K_4 + K_2 + K_1 + K_0;$ Eq. (56)

From Eq (51), we get $\beta_1 = K_4 + K_2 + K_0;$ Eq. (57)

From Eq (49) and (52), we get $\beta_7 + \beta_3 = K_3 + K_0;$ Eq. (58)

$$\beta_3 = K_4 + K_3 + K_2 + K_1; \quad \text{Eq. (59)}$$

From Eq (47), we get $\beta_5 = K_6 + K_4 + K_3 + K_2 + K_1;$ Eq. (60)

From Eq (48), we get $\beta_2 = K_6 + K_4 + K_3 + K_0;$ Eq. (61)

After all $\beta_j$ are found, $Z_1$ is found, as we know from Eq. (40), $Z_2$ can also be found by adding 1 (1000 0000) to it.

$X_1, X_2$ values are recovered by using Eq. (31), $$X_1 = \sigma_1 * Z_1;$$

$$X_2 = \sigma_1 * Z_2;$$

$$Y_2 = (S_0 X_1 + S_1)/\sigma_1; \qquad \text{Eq. (11)}$$

$$Y_1 = S_0 + Y_2; \qquad \text{Eq. (12)}$$

Above Y1 and Y2 are error symbol value, and $$e(x) = X_1 * Y_1 + X_2 * Y_2; \qquad \text{Eq. (62)}$$

Correct code word c(x) can be obtained from Eq. (1) by adding r(x) and e(x).

As above explained, error locations $X_1, X_2$ need only be calculated from $K_j$, which, in turn, comes from the syndrome value $\sigma_0/\sigma_1^2$ with very simple exclusive operations. It does not need either ROM-expensive silicon area that is proportional to the code size, or complex operation that requires lots of hardware for implementation.

The embodiments of the invention have various applications, among with which are memory system. On such application is in the integrated circuit card disclosed in a related application, i.e. U.S. Pat. No. 6,547,130, issued on Apr. 15, 2003, entitled "Integrated circuit card with fingerprint verification capability", the disclosure of which is incorporated herein as though set forth in full.

Figure 7:
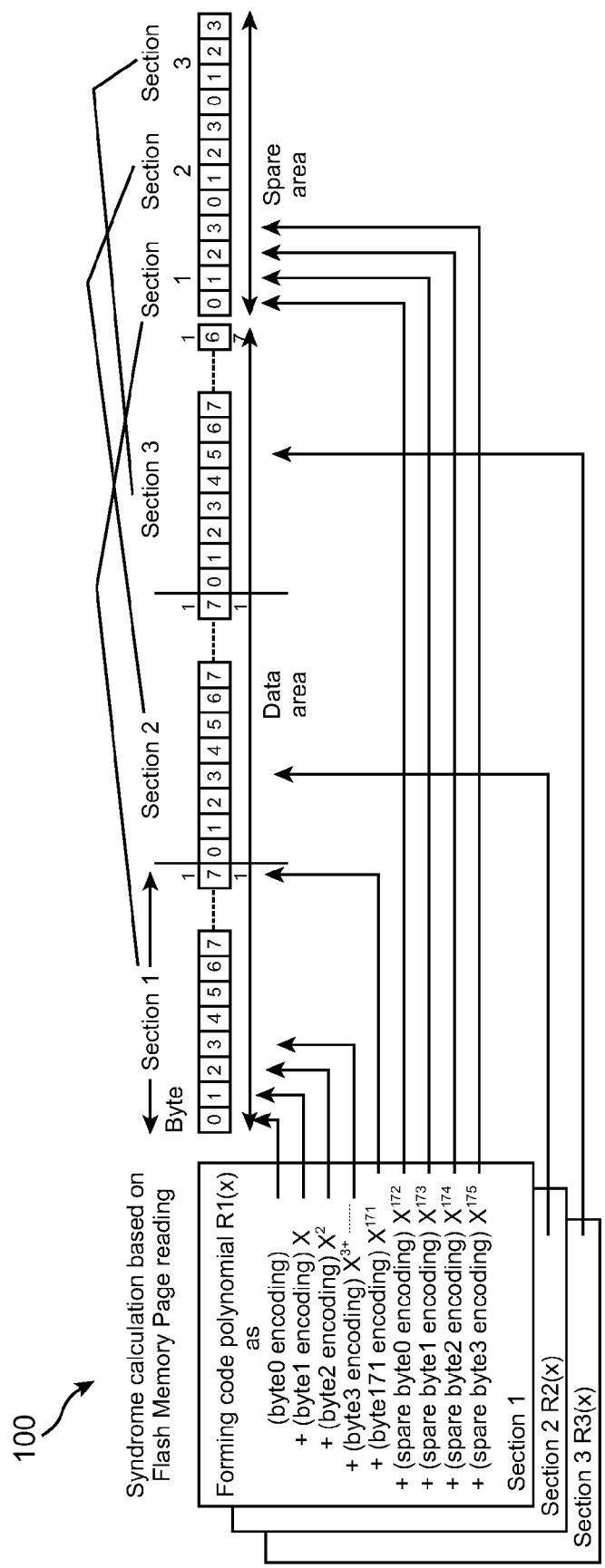
FIG. 7 shows a flow chart of the steps performed in recovering data, in accordance with one method of the present invention.
Figure 8:
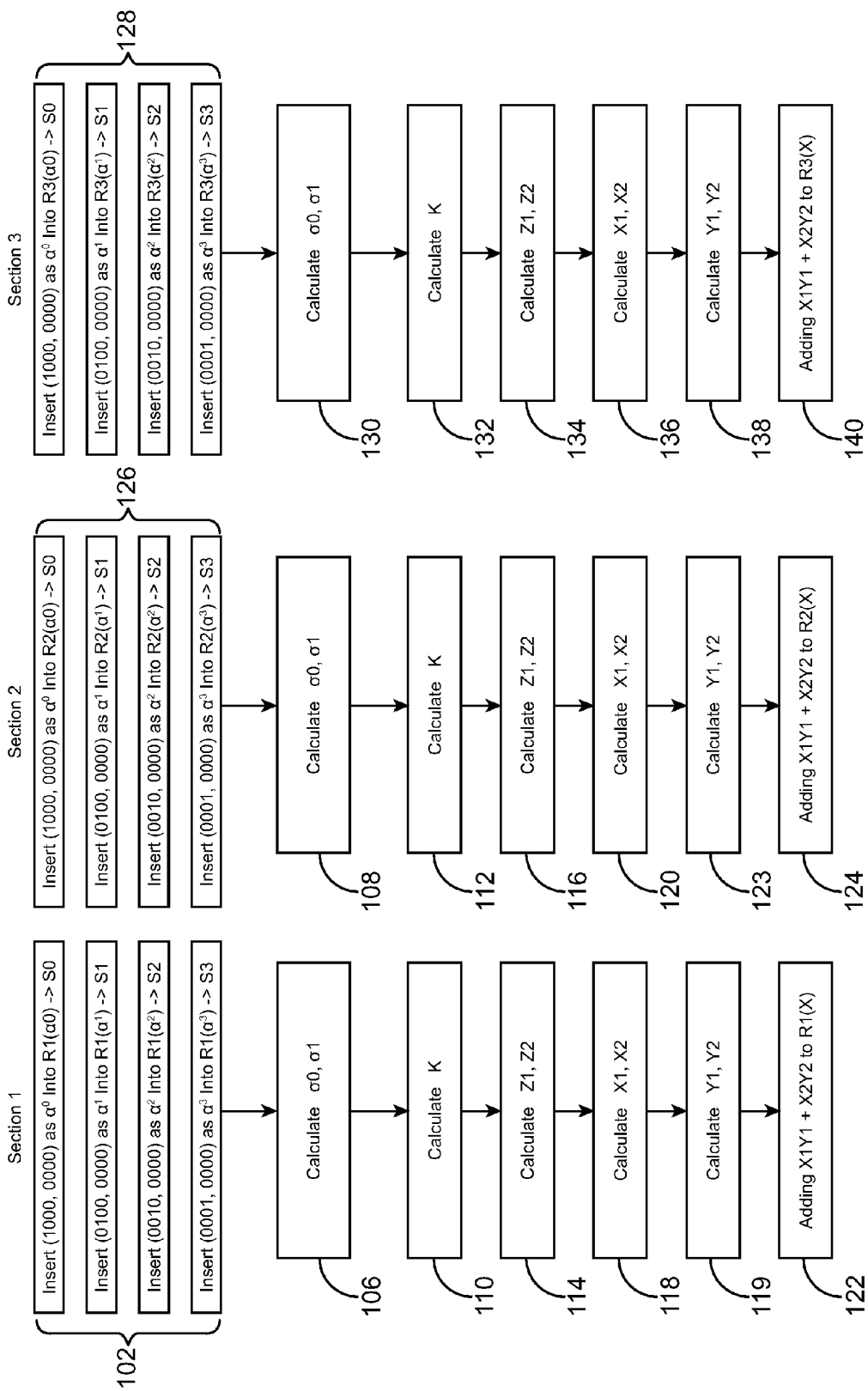
FIG. 8 shows a calculation or implementation of the Eq. (45) hereinabove.

Exemplary implementation of the foregoing is shown relative to FIGS. 7-8. FIG. 7 shows a flow chart of the steps performed in recovering data, in accordance with one method of the present invention. At step 100, the syndrome is calculated based on a flash memory page that is read from flash memory to form the code polynomial $R_1(x)$. As previously noted, a page is sectioned into three units or sections. Next, at 102, the syndromes $S_0$-$S_3$ are calculated, for the first section of the page, by inserting the respective binary values, such as '1000,0000' for $S_0$ and the like as α into $R_1(α)$. Similarly, $S_0$-$S_3$ for a second section of the page are calculated at step 126 and a $S_0$-$S_3$ for a third section of the page are calculated at step 128.

After step 102, $\sigma_0$ and $\sigma_1$ are calculated from the syndromes $S_0$-$S_3$, in accordance with the foregoing equations, for the first section, at step 106 and similarly, at step 108, after the step 126, the $\sigma_0$ and $\sigma_1$ are calculated from the syndromes $S_0$-$S_3$, in accordance with the foregoing equations, for the second section and at step 130, after step 128, the $\sigma_0$ and $\sigma_1$ are calculated from the syndromes $S_0$-$S_3$, for the third section of the page.

After the step 106, K is calculated, at step 110, based on the foregoing equations, for the first section and after the step 108, K is calculated, at step 112, for the second section of the page and after the step 130, at step 132, K is calculated for the third section of the page.

After the step 110, $Z_1$ and $Z_2$ are calculated, for the first section of the page, at step 114, based on the foregoing equations, for the first section and are used to calculate $X_1$ and $X_2$, at step 118 after which, at step 119, $Y_1$ and $Y_2$ are calculated, after which, at step 122, $X_1 * Y_1$, is added to $X_2 * Y_2$ and the sum thereof is added to $R_1(x)$. In this manner, the first data segment, is recovered. The notation "*" refers to the multiplication function or operator.

After the step 112, $Z_1$ and $Z_2$ are calculated, for the second section of the page, at step 116, based on the foregoing equations, and used to calculate $X_1$ and $X_2$, at step 120 after which, at step 123, $Y_1$ and $Y_2$ are calculated, after which, at step 124, $X_1 * Y_1$ is added to $X_2 * Y_2$ and the sum thereof is added to $R_2(x)$. In this manner, the second data segment, is recovered.

After the step 132, $Z_1$ and $Z_2$ are calculated, for the third section of the page, at step 134, based on the foregoing equations, and used to calculate $X_1$ and $X_2$, at step 136 after which, at step 138, $Y_1$ and $Y_2$ are calculated, after which, at step 140, $X_1 * Y_1$ is added to $X_2 * Y_2$ and the sum thereof is added to $R_3(x)$. In this manner, the third data segment, is recovered.

FIG. 8 shows a calculation or implementation of the Eq. (45) hereinabove. FIG. 9 shows a table of an example of RS(176, 172) coding wherein no errors have been detected. The last four bytes are parity bytes added by assuming data is equal to its address, as provided in the table.

Figure 10:
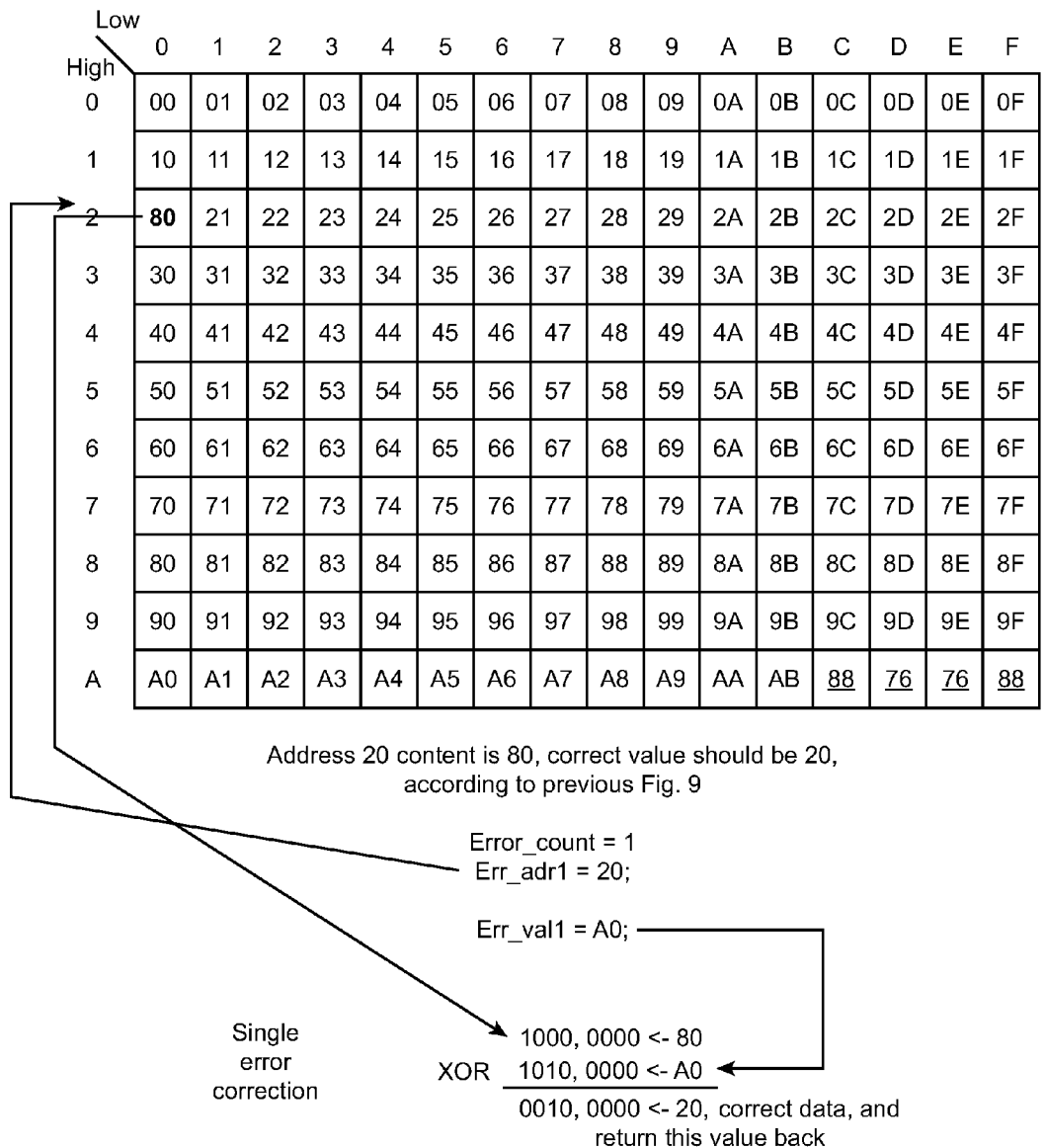
FIG. 10 shows a table of an example of RS(176, 172) coding wherein one error has been detected.

FIG. 10 shows a table of an example of RS(176, 172) coding wherein one error has been detected. The error is located at address 80 and the value at address 80 is erroneously 80 instead of 20, the actual value. Thus, the Error_count value is 1 indicating one error and the Err-adr1 (error address 1) is 20. The Err_val1, or the error value 1, is A0, in hexadecimal notation. The error is corrected after an exclusive Or (XOR) operation of 80 and A0 to obtain 20, the correct data.

FIG. 11 shows a table of an example of RS(176, 172) coding wherein two errors have been detected. The errors are located at addresses 20 and 30 and at address 20, the erroneous value is 80 instead of the correct value 20 and at address 30, the erroneous value is 90 instead of the correct value 30. In the case of the error at address 20, 80 is XORed with A0 to obtain the correct value 20 and in the case of the error at address 30, 90 is XORed with A0 to obtain the correct value 30.

Figure 14:
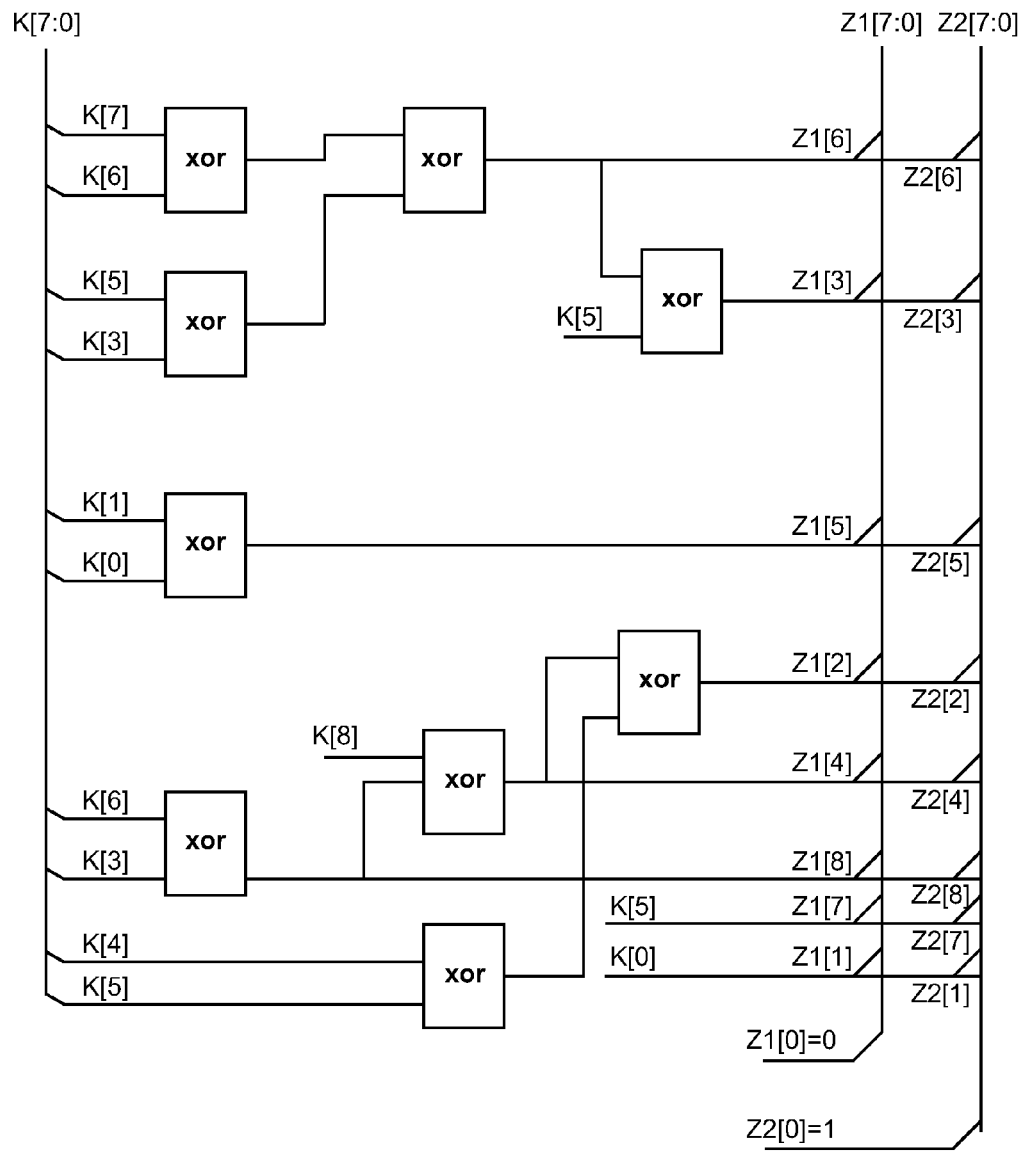
FIG. 14 shows further details of the gate implementation of $Z_1$, $Z_2$ generation, for the general approach RS coding, in accordance with an alternative embodiment of the present invention.

FIGS. 12-14 show various facets of the more general approach of RS applied to flash memory for large block page structures, in accordance with an alternative embodiment of the present invention.

An example of a large block flash memory is one that is 2 K (two thousand) bytes per page or more than 4 K bytes per page is using $GF(2^9)$ field by 2 symbol errors corrections (t=2). As we said before, each symbol will be 9 bits width and m=9. Maximum size with $GF(2^9)$ with two symbol errors as suggested in this invention, code size is $(2^9-1)=511\times9=4599$ bits, deduct $9\times t\times2=9\times4=36$ parity bits, message size is 4563 bits, and can cover 512 bytes without losing precision.

A 2 K byte page can be further divided into 4 sections as FIG. 11 shows, each section covers 512 bytes as shown. Associated parity bytes are 5 bytes, with 4 bits padding zeroes and 36 bits of parity. FIG. 12 shows an example of a page, in sections, using the general approach RS, in accordance with an alternative embodiment of the present invention. For example, in FIG. 12, four sections are shown to make up the data portion of a sector and page and each section is shown to include 512 bytes and the spare area is shown to include four sections, with 5 bytes in each section.

As m=9, all basic equations remains except 8 bits width expands to 9 bits.

Generation polynomial G(x) of $GF(2^9)$ is $X^9+X^4+1$, which Means $\alpha^9=\alpha^4+1$; Eq.(63A) Eq.(43)

$$Z_1 = \beta_1 * \alpha + \beta_2 * \alpha^2 + \beta_3 * \alpha^3 + \qquad \text{Eq. (63)}$$
$$\beta_4 * \alpha^4 + \beta_5 * \alpha^5 + \beta_6 * \alpha^6 + \beta_7 * \alpha^7 + \beta_8 * \alpha^8;$$

Then $$Z_1 + 1 = 1 + \beta_1 * \alpha + \beta_2 * \alpha^2 + \beta_3 * \alpha^3 + \qquad \text{Eq. (64)}$$
$$\beta_4 * \alpha^4 + \beta_5 * \alpha^5 + \beta_6 * \alpha^6 + \beta_7 * \alpha^7 + \beta_8 * \alpha^8;$$

$\beta_j$ is 1 or 0 only in above derivation, so equalities hold for $\beta_j * \beta_j = \beta_j$, $\beta_j + \beta_j = 0$.

(43), (44) These Two terms can be swapped without influence final result,

Multiply two terms together, we get $$(\beta_8*\alpha^{16}+\beta_7*\alpha^{14}+\beta_6*\alpha^{12}+\beta_5*\alpha^{10})+(\beta_8+\beta_4)*\alpha^8+\beta_7*\alpha^7+(\beta_6+\beta_3)*\alpha^6+\beta_5*\alpha^5+(\beta_4+\beta_2)*\alpha^4+\beta_3*\alpha^3+(\beta_2+\beta_1)*\alpha^2+\beta_1*\alpha=K;$$ Eq. (65)

$$[\beta_8(\alpha^2+\alpha^6+\alpha^7)+\beta_7*(1+\alpha^4+\alpha^5)+\beta_6*(\alpha^3+\alpha^7)+\beta_5*(\alpha+\alpha^5)]+(\beta_8+\beta_4)*\alpha^8+\beta_7*\alpha^7+(\beta_6+\beta_3)*\alpha^6+\beta_5*\alpha^5+(\beta_4+\beta_2)*\alpha^4+\beta_3*\alpha^3+(\beta_2+\beta_1)*\alpha^2+\beta_1*\alpha=K;$$ Eq. (66)

$$(\beta_8+\beta_4)*\alpha^8+(\beta_8+\beta_6+\beta_7)*\alpha^7+\beta_8+\beta_6+\beta_3)*\alpha^6+\beta_7*\alpha^5+(\beta_7+\beta_4+\beta_2)*\alpha^4+(\beta_6+\beta_3)*\alpha^3+(\beta_8+\beta_2+\beta_1)*\alpha^2+(\beta_5+\beta_1)*\alpha+\beta_7=K;$$ Eq. (67)

$\alpha^{16}=(0\ 0100\ 0110)=\alpha^2+\alpha^6+\alpha^7;$ $\alpha^{14}=(1\ 0001\ 1000)=1+\alpha^4+\alpha^5;$ $\alpha^{12}=(0\ 0010\ 0010)=\alpha^3+\alpha^7;$ $\alpha^{10}=(0\ 1000\ 1000)=\alpha+\alpha^5;$ $\alpha^8=(0\ 0000\ 0001);$ $\alpha^7=(0\ 0000\ 0010);$ $\alpha^6=(0\ 0000\ 0100);$ $\alpha^5=(0\ 0000\ 1000);$ $\alpha^4=(0\ 0001\ 0000);$ $\alpha^3=(0\ 0010\ 0000);$ $\alpha^2=(0\ 0100\ 0000);$ $\alpha=(0\ 1000\ 0000);$ Substitute these $\alpha$ values into above equations, we find

| | |
|---|---|
| $\beta_8+\beta_4=K_8;$ | Eq. (68) |
| $\beta_8+\beta_7+\beta_6=K_7;$ | Eq. (69) |
| $\beta_8+\beta_6+\beta_3=K_6;$ | Eq. (70) |
| $\beta_7+\beta_3=K_7+K_6;$ | Eqs. (69+70) |
| $\beta_7=K_5;$ | Eq. (71) |
| $\beta_7+\beta_4+\beta_2=K_4;$ | Eq. (72) |
| $\beta_4+\beta_2=K_4+K_5;$ | Eq. (72A) |
| $\beta_6+\beta_3=K_3;$ | Eq. (73) |
| $\beta_8+\beta_2+\beta_1=K_2;$ | Eq. (74) |
| $\beta_5+\beta_1=K_1;$ | Eq. (75) |
| $\beta_7=K_0;$ | Eq. (76) |
| $K=\sigma_0/\sigma_1^2$ | Eq. (53) |
| $=K_8*\alpha^8+K_7*\alpha^7+K_6*\alpha^6+K_5*\alpha^5+K_4*\alpha^4+K_3*\alpha^3+K_2*\alpha^2+K_1*\alpha^1+K_0;$ | |

$K_j(j=8\ldots0)$ is coefficient of 9 bit symbol value;

Comparing Eqs. (71) and (76), there is obtained $\beta_1=K_0;$ Eq. (76)

$\beta_7=K_5;$ Eq. (71)

from Eq. (75), we get $\beta_5=K_1+K_0;$

Add (69) and (70), and substitute $\beta_7$ in, we get $\beta_3=K_7+K_6+K_5;$

From Eq. (73), and substitute $\beta_3$ in, we get $\beta_6=K_7+K_6+K_5+K_3;$

From Eq. (69), and substitute $\beta_7$. $\beta 6$ in, we get $\beta_8=K_6+K_3;$ From Eq. (68), and substitute $\beta_8$ in, we get $\beta_4=K_8+K_6+K_3;$ From Eq. (74), and substitute $\beta_{8,b1}$ in, we get $\beta_2=K_8+K_6+K_5+K_4+K_3;$ After all $\beta_j$ are found, $Z_1$ is found, as we know from Eq. (40), $Z_2$ can also be found by adding $1(1\ 0000\ 0000)$ to it.

$X_1, X_2$ values are recovered by using Eq. (31) again.

FIG. 13 shows a calculation or implementation of the Eq. (65) hereinabove.

FIG. 14 shows further details of the gate implementation of $Z_1, Z_2$ generation, for the general approach RS coding, in accordance with an alternative embodiment of the present invention. In FIG. 14, a total of 9 XOR gates are used.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A electronic data storage card comprising:
   a Reed Solomon (RS) decoder including,
      a syndrome calculator block responsive to a page of information, the page including data and overhead, the data being organized into a plurality of data sections and the overhead being organized into a plurality of overhead sections, the syndrome calculator operative to generate a syndrome for each of the data sections;
      a root finder block coupled to receive the calculated syndrome and operative to generate at least two roots;
      a polynomial calculator block responsive to the at least two roots and operative to generate at least one error address, identifying a location in the data wherein the error lies; and
      an error symbol values calculator block coupled to the root finder and to the polynomial calculator block and operative to generate a second error address, identifying a second location in the data wherein the error (s) lie,
   wherein two errors are included in the page of information and assuming $i_1, i_2$ are two error locations in the data and Y1, Y2 are two error symbol values, the syndrome calculator block for generating four syndromes, S0, S1, S2 and S3, each corresponding to a section of the page of information in accordance with the following equations:

$$S_0 = Y_1 * X_1^0 + Y_2 * X_2^0 = Y_1 + Y_2 \neq 0$$

$$S_1 = Y_1 * X_1^1 + Y_2 * X_2^1 = Y_1 * X_1 + Y_2 * X_2 \neq 0;$$

$$S_2 = Y_1 * X_1^2 + Y_2 * X_2^2 \neq 0$$
$$= S_1 * \sigma_1 + S_0 * \sigma_0; \text{ and}$$

$$S_3 = Y_1 * X_1^3 + Y_2 * X_2^3 \neq 0$$
$$= S_2 * \sigma_1 + S_2 * \sigma_0 \text{ wherein,}$$

$\sigma 0$ and $\sigma 1$ are each an error location polynomial.

2. An electronic data storage card, as recited in claim 1, wherein the RS decoder for correcting up to at least two bytes of error in one page, each page being 512bytes of data area and 16 bytes of spare area wherein the plurality of data sections is three.

3. An electronic data storage card, as recited in claim 1, wherein the root finder block generates the at least two roots, $Z_1$ and $Z_2$, based upon a Galois Field (GF) ($2^8$) calculation.

4. An electronic data storage card, as recited in claim 1, wherein the root finder block generates roots based upon the following equation:

$$Z^2 + Z + K = 0.$$

5. An electronic data storage card, as recited in claim 3, wherein the root finder includes comparison logic for generating the at least two roots.

6. An electronic data storage card, as recited in claim 3, wherein the comparison logic is made of a plurality of XOR.

7. An electronic data storage card, as recited in claim 1, wherein the syndrome calculator includes combinatorial shift and comparison logic for generating each syndrome.

8. An electronic data storage card, as recited in claim 1, for implementing the equation: r(x)=c(x)+e(x), assuming r(x) is the receiving polynomial, c(x) is the correct code word polynomial, and e(x) is error polynomial.

9. A electronic data storage card comprising:
a Reed Solomon (RS) decoder including,
a syndrome calculator block responsive to a page of information, a page being two kilo bytes in size, the page including data and overhead, the data being organized into a plurality of data sections and the overhead being organized into a plurality of overhead sections, the syndrome calculator operative to generate a syndrome for each of the data sections;
a root finder block coupled to receive the calculated syndrome and operative to generate at least two roots, wherein the root finder block generates the at least two roots, $Z_1$ and $Z_2$, based upon a Galois Field (GF) ($2^9$) calculation;
a polynomial calculator block responsive to the at least two roots and operative to generate at least one error address, identifying a location in the data wherein the error lies; and
an error symbol values calculator block coupled to the root finder and to the polynomial calculator block and operative to generate a second error address, identifying a second location in the data wherein the error(s) lie;
wherein assuming $i_1$, $i_2$ are two error locations in the data and Y1, Y2 are two error symbol values, the syndrome calculator block being operative to generate four syndromes, S0, S1, S2 and S3, each syndrome corresponding to a section of the page of information in accordance with the following equations:

$$S_0 = Y_1 * X_1^0 + Y_2 * X_2^0 = Y_1 + Y_2 \neq 0$$

$$S_1 = Y_1 * X_1^1 + Y_2 * X_2^1$$
$$= Y_1 * X_1 + Y_2 * X_2 \neq 0;$$

$$S_2 = Y_1 * X_1^2 + Y_2 * X_2^2 \neq 0$$
$$= S_1 * \sigma_1 + S_0 * \sigma_0; \text{ and}$$

$$S_3 = Y_1 * X_1^3 + Y_2 * X_2^3 \neq 0$$
$$= S_2 * \sigma_1 + S_1 * \sigma_0 \text{ wherein,}$$

$\sigma 0$ and $\sigma 1$ are each an error location polynomial.

10. An electronic data storage card, as recited in claim 9, wherein the root finder block generates the at least two roots, $Z_1$ and $Z_2$, based upon a Galois Field (GF) ($2^8$) calculation.

11. An electronic data storage card, as recited in claim 9, wherein the root finder block generates roots based upon the following equation:

$$Z^2 + Z + K = 0.$$

12. An electronic data storage card, as recited in claim 11, wherein the root finder includes comparison logic for generating the at least two roots.

13. An electronic data storage card, as recited in claim 11, wherein the comparison logic is made of a plurality of XOR.

14. An electronic data storage card, as recited in claim 9, wherein the syndrome calculator includes combinatorial shift and comparison logic for generating each syndrome.

15. A method of detecting and correcting errors employed in a electronic data storage card comprising:
Receiving a page of information including data and overhead, the data being organized into a plurality of data sections and the overhead being organized into a plurality of overhead sections;
calculating a syndrome for each of the data sections based on a GF($2^8$) codeword;
receiving the calculated syndromes;
generating at least two roots;
generating at least one error address, identifying a location in the data wherein the error lies;
generating a second error address, identifying a second location in the data wherein the error(s) lie; and
assuming $i_1$, $i_2$ are the error address and the second error address, respectively, and Y1, Y2 are two error symbol values, generating four syndromes, S0, S1, S2 and S3, each syndrome corresponding to a section of the page of information in accordance with the following equations:

$$S_0 = Y_1 * X_1^0 + Y_2 * X_2^0 = Y_1 + Y_2 \neq 0$$

$$S_1 = Y_1 * X_1^1 + Y_2 * X_2^1$$
$$= Y_1 * X_1 + Y_2 * X_2 \neq 0;$$

$$S_2 = Y_1 * X_1^2 + Y_2 * X_2^2 \neq 0$$
$$= S_1 * \sigma_1 + S_0 * \sigma_0; \text{ and}$$

$$S_3 = Y_1 * X_1^3 + Y_2 * X_2^3 \neq 0$$
$$= S_2 * \sigma_1 + S_1 * \sigma_0 \text{ wherein,}$$

$\sigma 0$ and $\sigma 1$ are each an error location polynomial.

16. A method of detecting and correcting errors employed in a electronic data storage card comprising:

Receiving a page of information including data and overhead, the data being organized into a plurality of data sections and the overhead being organized into a plurality of overhead sections;

calculating a syndrome for each of the data sections based on a GF($2^9$) codeword;

receiving the calculated syndromes;

generating at least two roots;

generating at least one error address, identifying a location in the data wherein the error lies;

generating a second error address, identifying a second location in the data wherein the error(s) lie, and assuming $i_1$, $i_2$ are the error address and the second error address, respectively, and Y1, Y2 are two error symbol values, generating four syndromes, S0, S1, S2 and S3, each syndrome corresponding to a section of the page of information in accordance with the following equations:

$$S_0 = Y_1 * X_1^0 + Y_2 * X_2^0 = Y_1 + Y_2 \neq 0$$

$$S_1 = Y_1 * X_1^1 + Y_2 * X_2^1$$
$$= Y_1 * X_1 + Y_2 * X_2 \neq 0;$$

$$S_2 = Y_1 * X_1^2 + Y_2 * X_2^2 \neq 0$$
$$= S_1 * \sigma_1 + S_0 * \sigma_0; \text{ and}$$

$$S_3 = Y_1 * X_1^3 + Y_2 * X_2^3 \neq 0$$
$$= S_2 * \sigma_1 + S_1 * \sigma_0 \text{ wherein,}$$

σ0 and σ1 are each an error location polynomial.

17. An electronic data storage card, as recited in claim 1, for implementing the equation: r(x)=c(x)+e(x), assuming r(x) is the receiving polynomial, c(x) is the correct code word polynomial, and e(x) is error polynomial.

\* \* \* \* \*